(12) United States Patent
Paulasaari

(10) Patent No.: US 8,952,121 B2
(45) Date of Patent: Feb. 10, 2015

(54) POLYMER COMPOSITION AND METHOD OF MAKING THE SAME

(75) Inventor: Jyri Paulasaari, Espoo (FI)

(73) Assignee: Silecs OY, Espoo (FI)

( * ) Notice: Subject to any disclaimer, the term of this patent is extended or adjusted under 35 U.S.C. 154(b) by 0 days.

(21) Appl. No.: 13/489,515

(22) Filed: Jun. 6, 2012

(65) Prior Publication Data

US 2012/0322010 A1    Dec. 20, 2012

Related U.S. Application Data

(60) Provisional application No. 61/498,632, filed on Jun. 20, 2011.

(30) Foreign Application Priority Data

Jun. 20, 2011 (FI) ..................... 20115628

(51) Int. Cl.
*C08G 8/02* (2006.01)

(52) U.S. Cl.
USPC ............ 528/125; 524/592; 524/384; 524/114

(58) Field of Classification Search
USPC .................... 528/125; 524/592, 384, 114
IPC ....................... C08G 8/02,2261/3142
See application file for complete search history.

(56) References Cited

U.S. PATENT DOCUMENTS

| | | | |
|---|---|---|---|
| 4,618,566 A * | 10/1986 | Guillet et al. ............. | 430/271.1 |
| 5,034,296 A * | 7/1991 | Ong et al. .................... | 430/58.7 |
| 7,514,379 B2 * | 4/2009 | Nishiguchi et al. ........... | 442/173 |
| 8,058,384 B2 * | 11/2011 | Kato et al. .................... | 528/196 |
| 8,410,243 B2 * | 4/2013 | Veinot et al. ................. | 528/425 |
| 2004/0106758 A1 * | 6/2004 | Nishiguchi et al. ......... | 526/317.1 |
| 2006/0019195 A1 * | 1/2006 | Hatakeyama et al. ..... | 430/270.1 |
| 2007/0031699 A1 * | 2/2007 | Yamada et al. ............... | 428/690 |

FOREIGN PATENT DOCUMENTS

| | | | |
|---|---|---|---|
| EP | 1679336 A1 * | 7/2006 | |
| JP | 2013181097 A * | 9/2013 | |
| KR | 100874655 B1 | 12/2008 | |

* cited by examiner

*Primary Examiner* — Amanda C. Walke

(74) *Attorney, Agent, or Firm* — McCormick, Paulding & Huber LLP

(57) ABSTRACT

A novel novolac prepared by acid catalyzed condensation between biphenols or bisphenofluorenes and fluorenone is presented. The polymers exhibit excellent oxidative thermal stability and high carbon content, suitable for dielectric, etch stop applications as spin-on material.

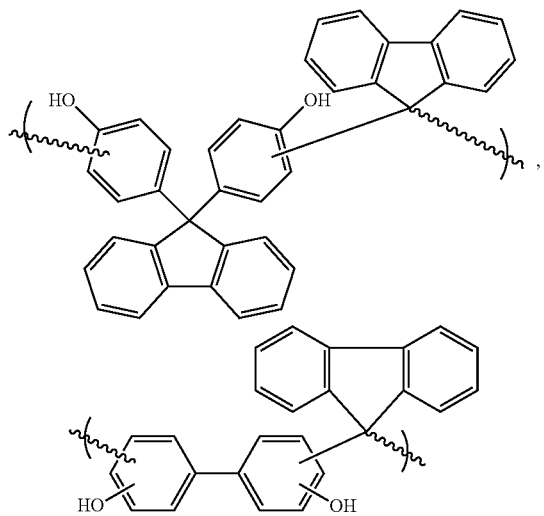

7 Claims, 1 Drawing Sheet

POLYMER COMPOSITION AND METHOD OF MAKING THE SAME

TECHNICAL FIELD

The present invention relates to new polymer compositions. In particular, the present invention concerns novel novolac polymer compositions for etch stop layers, said compositions having high thermal stability and high carbon content.

BACKGROUND ART

Etch stop layers are frequently used in semiconductor industry. Siloxane materials are etched by plasma of fluorocarbon gases such as $HCF_3$ and $CF_4$. Siloxane antireflective coatings are frequently used in the industry to facilitate sub-50 nm line widths. A common approach is to have a layer of high carbon content material underneath the Si-ARC to control or stop etching by fluorocarbon plasma. A material well suited for such layers is called amorphous carbon layer (frequently abbreviated ACL, cf. reference 1).

However, since ACL is deposited by CVD, high cost is commonly associated with ACL. Spin-on materials, on the other hand, are known to require low capital investments in tools, which makes them attractive alternatives. However, for being a viable substitute for ACL, the spin-on material needs to fulfill several requirements, such as high carbon content and high thermal stability up to 400° C., often in an oxidative atmosphere. Of course, they need to be soluble in a safe solvent commonly used in semiconductor industry. The film needs to be curable by heat to gain solvent resistance. It also needs to have good adhesion to the layers below and above. The solution on the other hand, needs to have satisfactory storage stability.

Novolacs are materials known for their relatively good thermal stability and good adhesion, and they are widely used in semiconductor industry, for example as dielectric materials and photoresists. Novolacs are polymers that are prepared by reacting phenol with formaldehyde with molar ratio of formaldehyde to phenol typically less than one, using acid catalysts. However, more broadly novolac is considered to be any polymer derived from acid or base catalyzed condensation of aldehydes with phenols or ketone-derived phenolic compounds, such as bisphenol A, which is a condensation product between acetone and phenol.

Aliphatic hydrogen atoms, that is, H-atoms that are covalently bonded to aliphatic C, are known to decrease thermal stability of polymers. This is because aliphatic hydrogen is easier cleaved by heat compared to their aromatic counterparts, yielding to a C. radical, which is susceptible to radical scission depolymerization of the polymer back bone into volatile components.

Scheme 1 shows the thermal stability of aliphatic versus aromatic hydrogen:

Scheme 1. Thermal stability

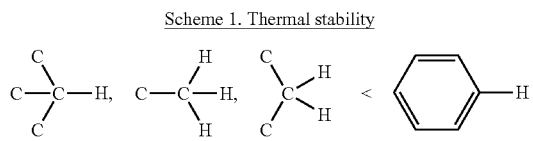

So, in theory, removal of aliphatic hydrogens from the polymer backbone should increase oxidative thermal stability of the polymer. However, polymers with high aromatic content tend to have poor solubility in common solvents, and for example poly-p-phenylene, consisting of benzene rings attached to each other at 1 and 4 position to form a chain, has no solubility in common solvents. This makes it unsuitable for polymer solutions for spin-coating applications.

SUMMARY OF INVENTION

Technical Problem

It is an aim of the present invention to eliminate at least a part of the problems relating to the background art and to provide compositions having high thermal stability and high carbon content.

It is another aim of the present invention to provide novel polymers having excellent oxidative thermal stability and high carbon content, suitable for dielectric, etch stop applications as spin-on material.

It is still a further aim of the invention to provide a novel method of producing novolac polymers. It is a fourth aim of the invention to provide a method of producing novel polymer compositions having improved properties suitable for use as dielectric, etch stop applications as spin-on material.

Solution to Problem

It has been found that novel novolacs can be obtained by reacting a phenolic compound with fluorenone in the presence of an acid catalyst and an optional solvent. By such a reaction, polymers according to Formula 1 are obtained, Formula 1

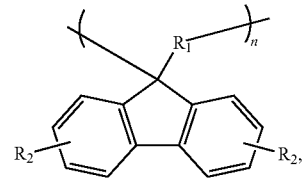

wherein n=1 . . . 100, and each $R_2$ is independently selected from hydrogen, $C_1$-$C_6$ alkyl, hydroxyl, $C_6$-$C_{10}$ aryl, and wherein $R_1$ is selected from:

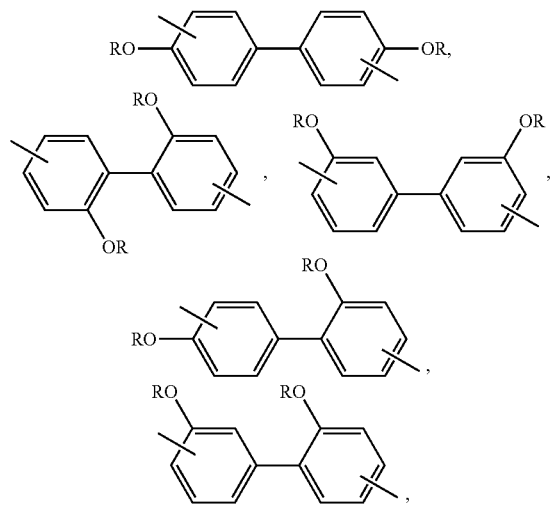

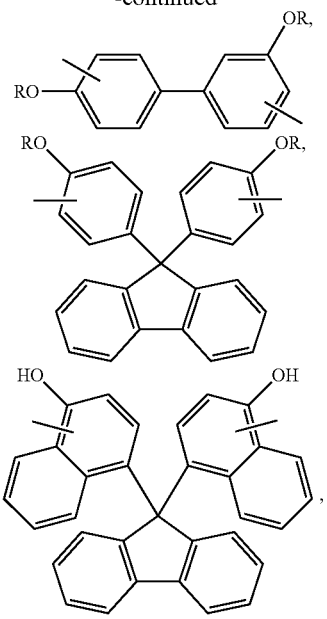

wherein R is hydrogen, alkyl or aryl.

The polymers can be formulated into compositions particularly suitable for film-forming by, e.g. spin-on application.

More specifically, the polymers according to the present invention are characterized by what is stated in the characterizing part of claim 1.

The method according to the present invention are characterized by what is stated in the characterizing part of claim 5.

The novel compositions are characterized by what is stated in the characterizing part of claim 8 and the films obtainable are characterized by what is stated in the characterizing part of claims 12 and 13.

Advantageous Effects of Invention

The present invention provides considerable advantages. Thus, the novel polymers exhibit excellent oxidative thermal stability and high carbon content, suitable for dielectric, etch stop applications as spin-on material. More particularly, the present polymers show excellent oxidative thermal stability which typically is about 100 . . . 200° C. higher than that of conventional novolacs measured by TGA.

Despite having no fluorine atoms, the polymers have surprisingly low dielectric constant, even below 3.0, which makes them suitable as high-temperature dielectric spin-on materials.

BRIEF DESCRIPTION OF DRAWINGS

Next the invention will be examined more closely with the aid of a detailed description and with reference to the attached drawings, in which.

DESCRIPTION OF EMBODIMENTS

Figure 1:
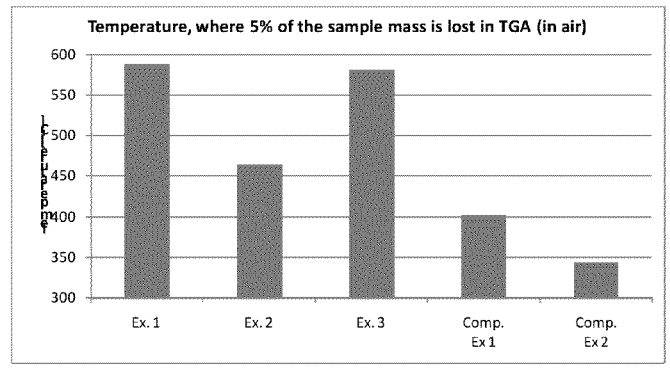
FIG. 1 shows the temperature at which a 5% weight loss occurs by TGA.
Figure 2:
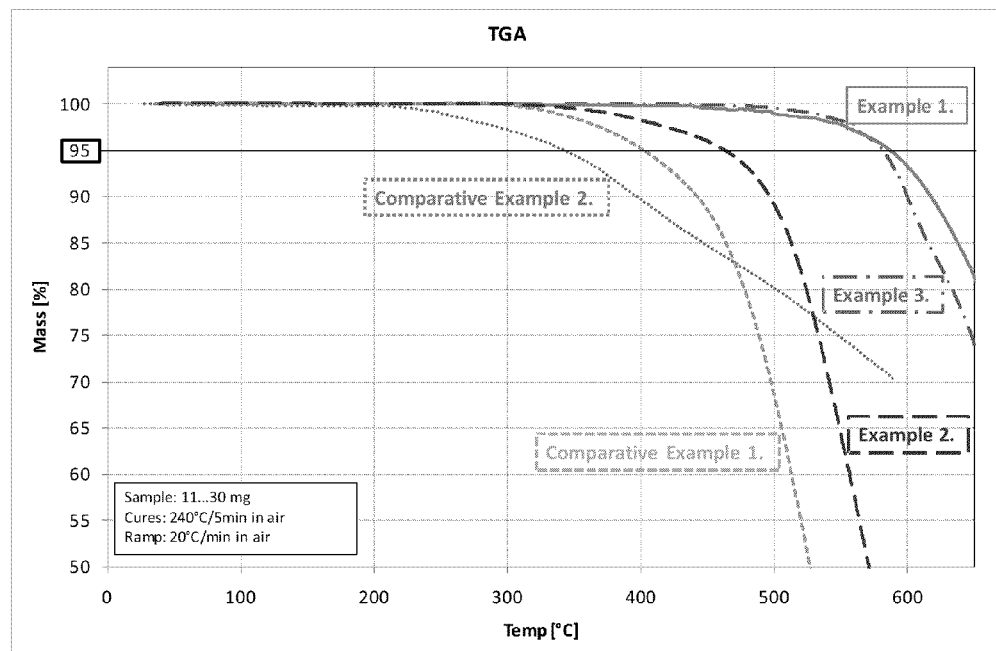
FIG. 2 indicates the outcome of thermogravimetric analyses of the example polymers in air.

It has surprisingly been found that novolac polymer without aliphatic hydrogen atoms can be prepared, which are soluble in common solvents. They are synthesized by acid catalyzed condensation polymerization of biphenols, bisphenolfluorene or bisnaphtholfluorene compounds with fluorenenone.

As mentioned above, polymers according to Formula 1 are obtained,

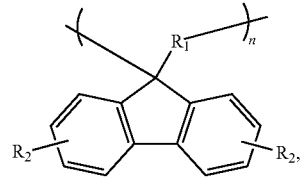

Formula 1 wherein n=1 . . . 100, and each $R_2$ is independently selected from hydrogen, $C_1$-$C_6$ alkyl, hydroxyl, $C_6$-$C_{10}$ aryl, and wherein $R_1$ is selected from:

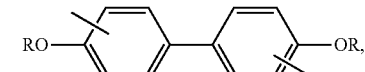

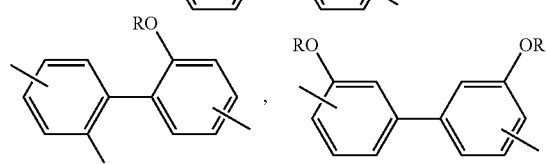

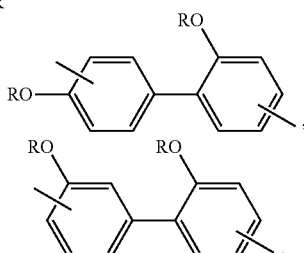

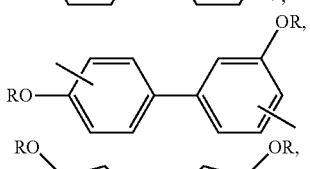

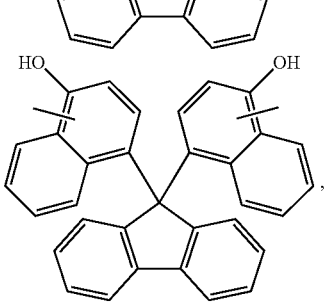

wherein R is hydrogen, alkyl or aryl.

In the above definitions, "alkyl" generally stands for a branched or linear, optionally substituted saturated hydrocarbyl radical (alkyl group).

In the meaning of $R_2$, the alkyl group preferably stands for a lower alkyl containing 1 to 6 carbon atoms, which optionally bears 1 to 3 substituents selected from methyl and halogen. Particularly preferred examples of $R_2$ and R include methyl, ethyl, n- or i-propyl, and n-, tert- or iso-butyl.

In the meaning of substituent R, "alkyl" preferably stands for a hydrocarbyl radical having 1 to 18, more preferably 1 to 14 and particularly 1 to 12 carbon atoms. The alkyl can be linear or, when branched, preferably is branched at the alpha or beta position, optionally further substituted with one or more, preferably two, $C_1$ to $C_6$ alkyl groups, or halogenated, in particular partially or fully fluorinated or per-fluorinated. Examples include non-fluorinated, partially fluorinated and per-fluorinated i-propyl, t-butyl, but-2-yl, 2-methylbut-2-yl, and 1,2-dimethylbut-2-yl.

Together with the adjacent oxygen atom, R forms an alkoxy group, preferably a lower alkoxy group, such as methoxy, ethoxy or isopropoxy group, which optionally is substituted.

The aryl group is preferably phenyl, which optionally bears 1 to 5 substituents selected from halogen, alkyl or alkenyl on the ring, or naphthyl, which optionally bear 1 to 11 substituents selected from halogen alkyl or alkenyl on the ring structure, the substituents being optionally fluorinated (including per-fluorinated or partially fluorinated)

As specific examples of the above polymerization reaction, the following may be shown (Reaction Scheme 1):

Reaction Scheme 1

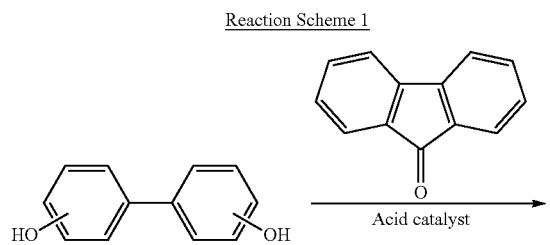

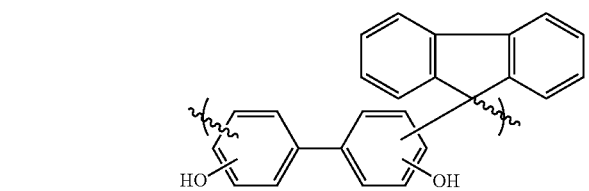

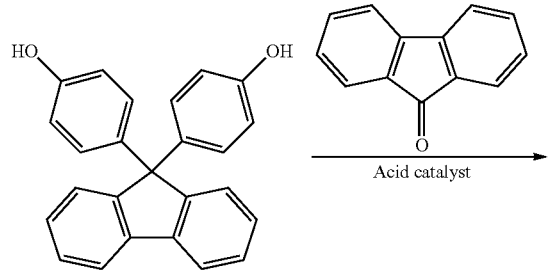

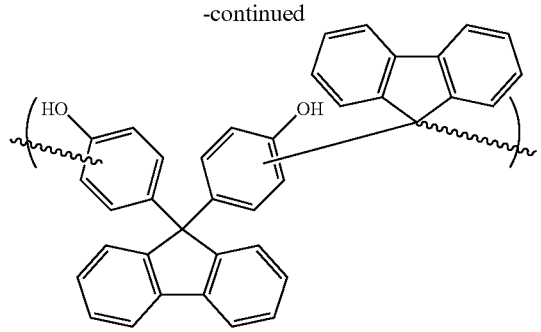

Polymers produced by the indicated reaction scheme typically contain a repeating unit according to Formula 2 or 3:

Formula 2

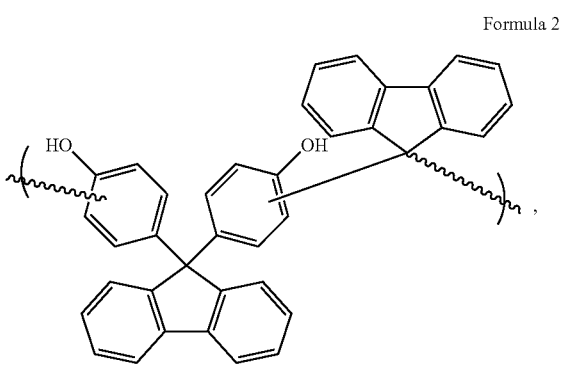

Formula 3

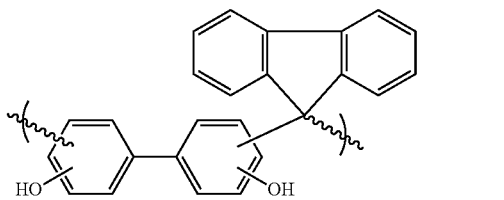

As mentioned above, the present novel novolac polymers have excellent oxidative thermal stability that is 100 . . . 200° C. higher than that of conventional novolacs measured by TGA. They contain few or no aliphatic hydrogens in their back bone. Their carbon content is high (>85%), which makes them especially suitable for replacement of ACL. Their etch rate by CF4/Ar plasma is low and highly independent on curing temperature, which makes the etch process robust. The polymers have surprisingly low dielectric constant, even below 3.0, which makes them suitable as high-temperature dielectric spin-on materials.

A polymer composition according to a preferred embodiment of the invention comprises a novolac polymer as described herein together with at least one component selected from the group of cross-linkers, organic solvents, cross-linker catalysts and surfactants.

The phenolic OHs of the polymers of the invention make it possible to cure the polymer to insoluble film with cross-linkers and curing catalyst commonly used with novolacs. The cross-linkers have typically functional groups that form covalent bond to phenolic-OH, or to aromatic carbons which are located at ortho position to phenolic OH. Such cross-linkers include, but are not limited to, hexamethoxymethyl methylol melamine resins, tetrakis(methoxymethyl)glycoluril, hexamethylenetetramine and epoxy containing cross-linkers such as epoxy resins and epoxy novolacs, commercial examples being DEN® and DER® 330, 332, 351, 353, 354, 425, 438, 736P, 732P by the Dow Chemical Company and SU-8® by Microchem, among others. Also hydroxymethylated aromatic compounds such as 2,4-dimethyl-6-(hydroxymethyl)phenol, mentioned in an article by Ueda, M. et. al. (reference 2), 1,4-bis(hydroxymethyl)benzene, or resols can be used as cross-linkers. The amount of cross-linker may vary between 1 . . . 49 w-% based on the novolac. It is preferred that lowest possible amount of cross-linker is used that is still capable to create fully cured film, since too high amount of cross-linker lowers the carbon content of the film and tends to have negative impact on the oxidative thermal stability of the film.

The curing catalyst may be acid or base catalyst. The acid catalyst is preferred and maybe latent in order to improve storage stability; the acid is only released by heat (thermal acid generator, TAG) or light (photo acid generator, PAG). Such latent acids include 1,1-bis[p-chlorophenyl]-2,2,2-trichloroethane (DDT); 1,1-bis[p-methoxyphenyl]-2,2,2-trichloroethane(Methoxychlor); 1,2,5,6,9,10-hexabromocyclododecane; 1,10-dibromodecane; 1,1-bis[p-chlorophenyl]-2,2-dichloroethane; 4,4min-dichloro-2-(trichloromethyl) benzhydrol or 1,1-bis(chlorophenyl)-2,2,2-trichloroethanol (Kelthane); hexachlorodimethylsulfone; 2-chloro-6-(trichloromethyl)pyridine; 0.0-diethyl-0-(3,5,6-trichloro-2-pyridyl) phosphorothioate (Dursban); 1,2,3,4,5,6-hexachlorocyclohexane; N(1,1-bis[p-chlorophenyl]-2,2,2-trichloroethylacetamide, tris[2,3-dibromopropyl] isocyanurate; 2,2-bis[p-chlorophenyl]-1,1-dichloroethylene and their analogs, various triazines bearing trichloromethyl groups, PAGs of sulfonium and iodium salts. If photo acid catalyst is used, the film may be optionally patterned by activating the acid only on the areas exposed to UV-light.

The amount of curing catalyst can vary between 0.01 . . . 10 w % based on the polymer, but typically 0.1 . . . 5 w % is used. If the amount of curing catalyst is too low, the cross-linking reaction becomes too slow or is even completely retarded due to possible small amounts of basic impurities in the polymer solution that neutralize the catalyst. If the amount of the catalyst is too high, material properties are sacrificed and possible contamination of process equipment may occur.

The polymerization is run at 150 . . . 295° C., preferably at 180 . . . 240° C. The polymerization can be run neat, but high boiling point solvent can be used for dilution to facilitate proper stirring. The amount of solvent is typically between 0 . . . 50%, preferably between 5 . . . 50%. To dilute reaction makes the polymerization uneconomical and also limits the molecular weight obtained. The acid catalyst can be any acid strong enough to cause the reaction to take place and is used between 0.1 . . . 10% in the polymerization solution. High boiling point acids are preferred, so that they don't evaporate along with condensation water, but instead remain in the solution at the high temperatures used during the reaction. Good acids are alkyl or aryl sulfonic acid, such as benzenesulfonic acid, paratoluenesulfonic acid, methane sulfonic acid, sulfuric acid, or alkyl or aryl esters of thereof.

After the reaction, the solution is neutralized with a base such as amine, and the polymer is purified by precipitation with non-solvents and/or water washes. Finally, the polymer is either first dried and then dissolved in a casting solvent, or directly solvent-exchanged to a casting solvent or solvents. The casting solvent can be selected from the group of solvents comprising propylene glycol methyl ether acetate, dipropylene glycol methyl ether acetate, n-methyl-2-pyrrolidone, anisole, benzyl alcohol, toluene, ethylbenzene, xylene, mesitylene, dimethylacetamide, dimethylformamide, 1,3-dimethyl-3,4,5,6-tetrahydro-2(1H)-pyrimidinone, hexamethylphosphoramide, propylene glycol methyl ether, propylene glycol ethyl ether, propylene glycol propyl ether, methyl lactate, ethyl lactate, propyl lactate, ethyl acetate, propyl acetate, butyl acetate, cyclopentanone, cyclohexanone, dimethylsulfoxide, methyl isobutyl ketone, methyl ethyl ketone, methyl propyl ketone, 2-heptanone, gamma-butyrolactone, ethyl 3-ethoxypropionate, ethyl 3-methoxypropionate, ethyl pyruvate, ethyl cellosolve acetate, tetrahydrofurfuryl alcohol, isopropanol, butanol and any mixtures thereof.

The film quality can be improved by use of wetting agents and surfactants. Suitable wetting agents and surfactants include siloxane based surfactants such as BYV306 and other BYK® surfactant from Byk-Chemie GmbH. They can also be fluorosurfactants such as Novec® FC-4432 and other Novec® Fluorosurfactants from 3M. Other possible useful surfactants include co-polymers or ethylene oxide and propylene oxide such as Pluronic® additives by BASF and alkylphenol ethoxylate surfactant such as TERGITOL™ surfactants by The Dow Chemical Company.

In summary, in a preferred embodiment, the surfactant is a fluorosurfactant, a siloxane surfactant or an alkylphenol ethoxylate surfactant or an ethylene or propylene oxide surfactant.

The final polymer solution is then filtered to remove foreign particles, followed by spin coating, spray coating, dip coating or slit coating of the substrate. Solvent is removed by soft bake at 50 . . . 150° C., and the film is finally cured at 200 . . . 400° C. to yield a cross-linked polymer film.

The composition is suitable for film-forming by conventional procedures. In particular, the composition can be used in spin-on applications.

In a first embodiment, a polymer film is obtained from a polymer composition of the present kind by the steps of
a) applying the material or composition on a substrate;
b) removing the solvent by soft bake; and
c) curing the film by heat at 200 . . . 450° C.

In a second embodiment, a patterned polymer film can be obtained from a polymer composition of the present kind by the steps of
a) applying the material or composition containing a photo acid generator on a substrate;
b) removing the solvent by soft bake,
c) partially exposing the film to UV-light to activate the acid,
d) heating the substrate to cause cross-linking of the exposed areas,
e) developing the unexposed areas by suitable solvent, and
f) curing the patterned film by heat at 200 . . . 450° C.

The following non-limiting working examples illustrate the invention:

EXAMPLES

Example 1

Fluorenone (50.5 g), 4,4'-dihydroxybiphenyl (51.7 g) and diphenyl ether (10 g) were placed in a 250 mL rb flask, equipped with a magnetic stir bar and a glass stop cock having a PTFE sleeve. The flask was heated to +223° C. When the monomers melted to slurry, methane sulfonic acid (MSA, 0.6 mL, 70% water solution) was added in drop wise. The flask was quickly purged with argon, and the stop cock was loosely attached to the flask. The condensation reaction was allowed to proceed for 85 hours at +223° C. The reaction produced water, which escaped through between the joint and the loose stop cock as steam, while it was formed.

After the reaction, more diphenyl ether (100 mL) was added to facilitate proper stirring, and the content of the flask was cooled to room temperature. Triethylamine (2 g) was added to neutralize the MSA, after which the whole solution was poured into methanol (1 Lg). The polymer precipitated out, and was separated by filtration. It was dissolved in N-methylpyrrolidone (NMP, 200 g) and re-precipitated once more with methanol (1 L). After filtration, the polymer was dissolved in propylene glycol methyl ether acetate (PGMEA, 500 g), and remaining methanol was removed in a rotary evaporator. Polymer solution (355 g, solid content 19.3%) having Mw/Mn=54,641/3,882 by GPC using dimethylacetamide (DMAc) as eluent was obtained. In addition to PGMEA, the polymer was found to be soluble in common solvents such as NMP, anisole, DMAc, dichloromethane and diphenyl ether. Theoretical carbon content is 86.2%.

A solution for spin-coating was prepared by diluting the polymer to 13.5% solution in PGMEA. 1% surfactant (BYV-306 by BYK-Chemie GmbH), 5% Cross-linker (Resimene® 747 by INEOS Melamines GmbH) and 0.5% thermoacid catalyst (K-pure® CXC-1614 by King Industries) were added. The solution was then filtered through a 0.1 μm PTFE-filter and spin-coated on a GaAs wafer, silicon wafer and a wafer with silicon nitride coating. The films were soft baked at 240° C./1 min, followed by cure at 400° C./2 min (air). A 651 nm thick film with RI=1.672 was obtained, which was resistant to common solvents. The film passed Scotch-tape test after 240° C. and 400° C. cures, indicating good adhesion both on silicon nitride and on silicon. The film had low dielectric constant k=2.91 after 400° C./air cure, and low CTE 17.5 ppm/C, calculated from its stress vs. temperature values on Si and GaAs wafers.

Example 2

Fluorenone (25 g) and 2,2'-dihydroxybiphenyl (25.8 g) were placed in a 100 mL rb flask with a magnetic stir bar, and a Dean-Stark apparatus was attached to the flask. The content of the flask was heated to 190° C., and MSA (0.1 mL) was added. The reaction was allowed to proceed for overnight, after which the polymer was dissolved in diphenyl ether (50 g). After cooling to rt, TEA (2 mL) was added, and the polymer was precipitated into methanol (1 L), followed by filtration and drying. Solid polymer (24 g) was obtained, with Mw/Mn=2,276/1,084 by GPC (in THF). Theoretical carbon content is 86.2%.

Example 3

Fluorenenone (7.7 g), 9,9-bis(4-hydroxyphenyl)fluorene (15 g) and diphenyl ether (8 g) were melted in a rb flask at 170° C. MSA (0.1 mL) was added, and the flask was purged with argon. Temperature was gradually increased to 223° C., where it was kept for 66 hours. More diphenyl ether (15 g) was added to facilitate stirring while the flask was cooled to rt, after which TEA (0.5 mL) was added to neutralize the acid. The polymer was precipitated three times with PGMEA/methanol solvent/non-solvent pair. Light brown polymer (14.4 g) with Mw/Mn=2,360/1,401 was obtained by GPC (in THF). Low molecular fractions could be removed by washing the powder with acetone (borderline non-solvent).

This way, Mw/Mn=3,473/2,477 was obtained (yield ~50%, film RI=1.671). Theoretical carbon content is 89.0%.

Comparative Example 1

Based on Korean Patent Application No. 100874655 B1, a material was prepared by a condensation reaction, catalyzed by para-toluenesulfonic acid (pTSA, 0.3 g), between 9,9-bis(4-hydroxyphenyl)fluorene (22 g) and 1-naphthaldehyde (9 g) in tetrahydronaphthalene at 180° C. for 70 hours. The polymer was cooled, and neutralized with triethanolamine (2 mL), followed by precipitation from hexane/isopropanol=3/7 three times. Polymer with Mw/Mn=1,885/818 was obtained.

Comparative Example 2

A typical novolac was prepared by pTSA catalyzed reaction between phenol (30 g), formaldehyde (11.5 g, as 37% solution) and benzaldehyde (15 g) on reflux at 125° C. for 46 hours. The polymer was washed with hot water three times, to yield polymer with Mw/Mn=2,459/1,021.

TABLE 1

Thickness loss (shrinkage) between soft bake (240° C./1 min/air) and cure (400° C./2 min/air)

| Material | Thickness loss |
|---|---|
| Example 1 | 0.3% |
| Example 2 | 4.9% |
| Example 3 | 7.3% |
| Comparative example 1 | 11% |
| Comparative example 2 | 18% |

TABLE 2

Etch rate after 400° C. cure and the increase in etch rate between soft bake (240° C./1 min/air) and cure (400° C./2 min/air). CF4/Ar plasma was used for etching (thermal-SiO$_2$ ~39.2 nm/min)

| Material | Etch rate [nm/min] | Change [%] |
|---|---|---|
| Example 1 | 23.5 | 2.1 |
| Example 2 | 23.4 | 5.6 |
| Example 3 | NM | NM |
| Comparative example 1 | 23.5 | 12.5 |
| Comparative example 2 | 28.0 | 22.9 |

Industrial Applicability

The present products are suitable in the semiconductor industry as a hard mask and dielectric material.

Citation List
1. U.S. Pat. No. 7,335,462
2. Ueda, M., et al., Macromolecules (1996), 29, 6427
3. Korean Patent Application No. 100874655 B1

The invention claimed is:
1. A polymer having Formula 1

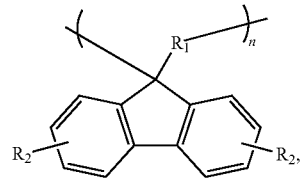

Formula 1 wherein
n =1 ... 100, and
each $R_2$ is independently selected from hydrogen, $C_1$-$C_6$ alkyl, hydroxyl, $C_6$-$C_{10}$ aryl, and wherein $R_1$ is selected from:

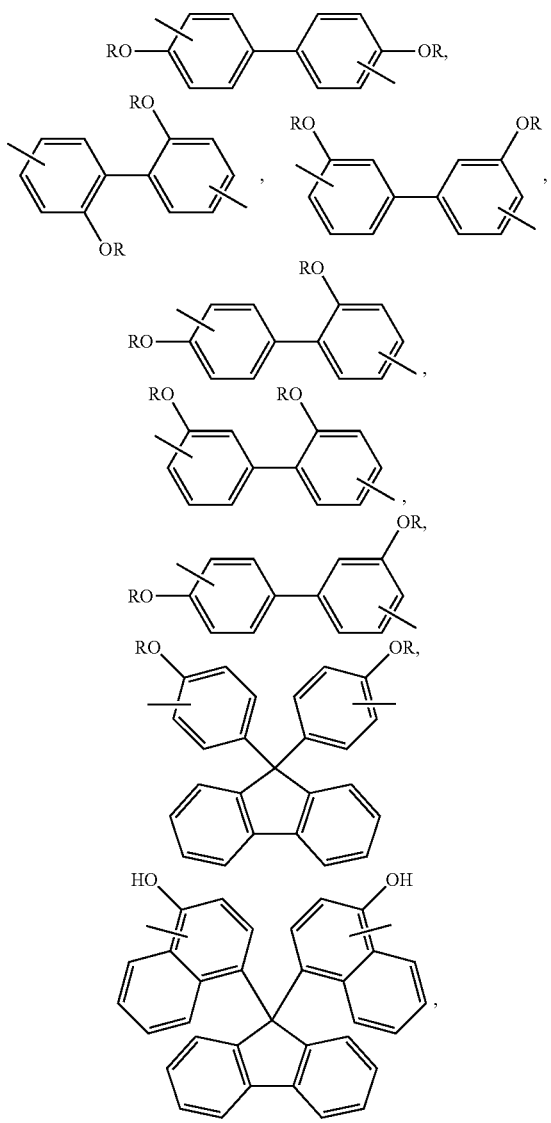

wherein R is hydrogen, alkyl or aryl.

2. The polymer according to claim 1, wherein each $R_2$ is hydrogen.

3. The polymer according to claim 1, wherein the polymer has a repeating unit according to Formula 2 or 3:

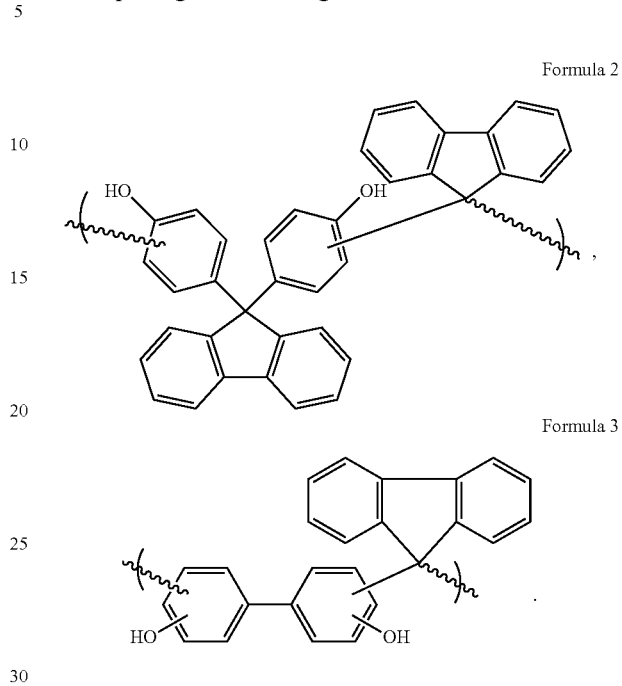

4. A method of preparing a polymer according to claim 1, where a bisphenol or a bisphenofluorene is reacted with fluorenone in the presence of an acid.

5. A method of preparing a polymer according to claim 1, where a phenolic compound is reacted with fluorenone in the presence of an acid catalyst and an optional solvent.

6. The method according to claim 5, wherein the phenolic compound is selected from the group of 4,4'-dihydroxybiphenyl, 2,2'-dihydroxybiphenyl, 3,3'-dihydroxybiphenyl, 2,3'-dihydroxybiphenyl, 2,4'- dihydroxybiphenyl, 3,4'-dihydroxybiphenyl, 9,9-bis(4-hydroxyphenyl)fluorene and 9,9-bis(4-hydroxynaphthyl)fluorene.

7. The method according to claim 5, wherein the acid catalyst is selected from the group of alkylsulfonic acid, arylsulfonic acid, sulfuric acid, and their alkyl or aryl esters.

* * * * *